US012104856B2

(12) United States Patent
Lewis et al.

(10) Patent No.: US 12,104,856 B2
(45) Date of Patent: Oct. 1, 2024

(54) METHOD AND DEVICE FOR OPTIMIZATION OF VAPOR TRANSPORT IN A THERMAL GROUND PLANE USING VOID SPACE IN MOBILE SYSTEMS

(71) Applicant: Kelvin Thermal Technologies, Inc., Boulder, CO (US)

(72) Inventors: Ryan John Lewis, Boulder, CO (US); Ronggui Yang, Broomfield, NY (US); Yung-Cheng Lee, Boulder, CO (US)

(73) Assignees: Kelvin Thermal Technologies, Inc., Boulder, CO (US); THE REGENTS OF THE UNIVERSITY OF COLORADO, A BODY CORPORATE, Denver, CO (US)

(*) Notice: Subject to any disclaimer, the term of this patent is extended or adjusted under 35 U.S.C. 154(b) by 96 days.

(21) Appl. No.: 15/787,455

(22) Filed: Oct. 18, 2017

(65) Prior Publication Data

US 2018/0106554 A1    Apr. 19, 2018

Related U.S. Application Data

(60) Provisional application No. 62/410,229, filed on Oct. 19, 2016.

(51) Int. Cl.
*F28D 15/04* (2006.01)
*F28D 15/02* (2006.01)
(Continued)

(52) U.S. Cl.
CPC ........... *F28D 15/046* (2013.01); *F28D 15/02* (2013.01); *F28D 15/0233* (2013.01);
(Continued)

(58) Field of Classification Search
CPC ...... F28D 15/02; F28D 15/0233; F28D 15/04; B23P 15/26
See application file for complete search history.

(56) References Cited

U.S. PATENT DOCUMENTS

| 4,000,776 A | 1/1977 | Kroebig et al. |
| 4,274,479 A | 6/1981 | Eastman |

(Continued)

FOREIGN PATENT DOCUMENTS

| CN | 2522409 Y | 11/2002 |
| CN | 2715467 Y | 8/2005 |

(Continued)

OTHER PUBLICATIONS

American Heritage Dictionary of the English Language, 5th ed. (2022) (definition of "gap").*

(Continued)

*Primary Examiner* — Jenna M Hopkins

(57) ABSTRACT

Some embodiments of the invention include a thermal ground plane with a variable thickness vapor core. For example, a thermal ground plan may include a first casing and a second casing where the second casing and the first casing configured to enclose a working fluid. The thermal ground plane may also include an evaporator region disposed at least partially on at least one of the first casing and the second casing; a condenser region disposed at least partially on at least one of the first casing and the second casing; and a wicking layer disposed between the first casing and the second casing a vapor core defined at least partially by a gap between the first casing and the second casing. The thickness of the gap can vary across the first casing and the second casing.

14 Claims, 14 Drawing Sheets

(51) Int. Cl.
*H01L 23/427* (2006.01)
*H01L 23/433* (2006.01)
*B23P 15/26* (2006.01)

(52) U.S. Cl.
CPC ............ *F28D 15/04* (2013.01); *H01L 23/427* (2013.01); *H01L 23/433* (2013.01); *B23P 15/26* (2013.01)

(56) References Cited

U.S. PATENT DOCUMENTS

| | | | |
|---|---|---|---|
| 4,279,294 A | 7/1981 | Fitzpatrick et al. | |
| 4,545,799 A | 10/1985 | Rhodes et al. | |
| 4,854,379 A | 8/1989 | Shaubach et al. | |
| 5,000,256 A | 3/1991 | Tousignant | |
| 5,175,975 A | 1/1993 | Benson et al. | |
| 5,343,940 A | 9/1994 | Jean | |
| 5,360,058 A | 11/1994 | Koeppl et al. | |
| 5,560,423 A | 10/1996 | Larson et al. | |
| 5,735,339 A | 4/1998 | Davenport et al. | |
| 6,056,044 A | 5/2000 | Benson et al. | |
| 6,082,443 A * | 7/2000 | Yamamoto | F28D 15/0233 165/104.21 |
| 6,158,502 A * | 12/2000 | Thomas | F28D 15/02 165/104.26 |
| 6,269,866 B1 * | 8/2001 | Yamamoto | F28D 15/0233 165/104.26 |
| 6,446,706 B1 | 9/2002 | Rosenfeld et al. | |
| 6,533,029 B1 | 3/2003 | Phillips | |
| 6,561,262 B1 | 5/2003 | Osakabe et al. | |
| 6,763,671 B1 | 7/2004 | Klett et al. | |
| 6,896,039 B2 | 5/2005 | Dussinger et al. | |
| 6,912,130 B2 | 6/2005 | Osanai et al. | |
| 6,938,481 B2 | 9/2005 | Paterek et al. | |
| 6,994,151 B2 | 2/2006 | Zhou et al. | |
| 7,028,713 B2 | 4/2006 | Koyama | |
| 7,037,400 B1 * | 5/2006 | Shaw | B01J 19/0093 156/250 |
| 7,069,978 B2 | 7/2006 | Rosenfeld et al. | |
| 7,100,680 B2 | 9/2006 | Dussinger et al. | |
| 7,278,469 B2 | 10/2007 | Sasaki et al. | |
| 8,018,128 B2 | 9/2011 | Egawa et al. | |
| 8,069,907 B2 | 12/2011 | Bryant et al. | |
| 8,579,018 B1 | 11/2013 | Roper et al. | |
| 8,646,281 B2 | 2/2014 | Lim | |
| 8,807,203 B2 | 8/2014 | Macdonald et al. | |
| 8,921,702 B1 * | 12/2014 | Carter | H05K 1/0204 165/104.11 |
| 8,985,197 B2 | 3/2015 | Wang | |
| 9,136,883 B1 | 9/2015 | Moher et al. | |
| 9,651,312 B2 | 5/2017 | Yang et al. | |
| 9,700,930 B2 | 7/2017 | Yang | |
| 9,835,383 B1 * | 12/2017 | Roper | F28D 15/04 |
| 9,909,814 B2 | 3/2018 | Yang et al. | |
| 9,921,004 B2 | 3/2018 | Lewis et al. | |
| 10,281,220 B1 | 5/2019 | Lin et al. | |
| 10,458,719 B2 * | 10/2019 | Bozorgi | F28D 15/0233 |
| 10,527,358 B2 | 1/2020 | Yang et al. | |
| 10,571,200 B2 | 2/2020 | Yang et al. | |
| 2001/0054495 A1 | 12/2001 | Yevin et al. | |
| 2003/0042009 A1 | 3/2003 | Phillips | |
| 2003/0079863 A1 | 5/2003 | Sugito et al. | |
| 2003/0102118 A1 | 6/2003 | Sagal et al. | |
| 2003/0136547 A1 | 7/2003 | Gollan et al. | |
| 2003/0136550 A1 | 7/2003 | Tung et al. | |
| 2003/0136551 A1 | 7/2003 | Bakke | |
| 2003/0159806 A1 | 8/2003 | Sehmbey et al. | |
| 2004/0011509 A1 | 1/2004 | Siu | |
| 2004/0050533 A1 | 3/2004 | Chesser et al. | |
| 2004/0131877 A1 | 7/2004 | Hasz et al. | |
| 2004/0134548 A1 | 7/2004 | Koyama | |
| 2004/0244951 A1 | 12/2004 | Dussinger et al. | |
| 2005/0059238 A1 | 3/2005 | Chen et al. | |
| 2005/0126757 A1 | 6/2005 | Bennett et al. | |
| 2005/0190810 A1 | 9/2005 | Butterworth et al. | |
| 2005/0230085 A1 | 10/2005 | Valenzuela | |
| 2005/0280128 A1 | 12/2005 | Mok et al. | |
| 2005/0280162 A1 | 12/2005 | Mok et al. | |
| 2006/0032615 A1 | 2/2006 | Dussinger et al. | |
| 2006/0037737 A1 | 2/2006 | Chen et al. | |
| 2006/0090882 A1 | 5/2006 | Sauciuc | |
| 2006/0098411 A1 | 5/2006 | Lee | |
| 2006/0124280 A1 | 6/2006 | Lee et al. | |
| 2006/0131002 A1 | 6/2006 | Mochizuki et al. | |
| 2006/0196640 A1 | 9/2006 | Siu | |
| 2006/0196641 A1 | 9/2006 | Hong et al. | |
| 2006/0213648 A1 | 9/2006 | Chen et al. | |
| 2006/0283574 A1 | 12/2006 | Huang | |
| 2006/0283576 A1 | 12/2006 | Lai et al. | |
| 2007/0035927 A1 | 2/2007 | Erturk et al. | |
| 2007/0056714 A1 | 3/2007 | Wong | |
| 2007/0068657 A1 | 3/2007 | Yamamoto et al. | |
| 2007/0077165 A1 | 4/2007 | Hou et al. | |
| 2007/0089864 A1 | 4/2007 | Chang et al. | |
| 2007/0107875 A1 | 5/2007 | Lee et al. | |
| 2007/0107878 A1 | 5/2007 | Hou et al. | |
| 2007/0158050 A1 | 7/2007 | Norley | |
| 2008/0017356 A1 | 1/2008 | Gruss et al. | |
| 2008/0029249 A1 | 2/2008 | Hsiao | |
| 2008/0067502 A1 | 3/2008 | Chakrapani et al. | |
| 2008/0111151 A1 | 5/2008 | Teraki et al. | |
| 2008/0128116 A1 | 6/2008 | Dangelo et al. | |
| 2008/0128898 A1 | 6/2008 | Henderson et al. | |
| 2008/0210407 A1 | 9/2008 | Kim et al. | |
| 2008/0224303 A1 | 9/2008 | Funakoshi et al. | |
| 2008/0272482 A1 | 11/2008 | Jensen et al. | |
| 2008/0283222 A1 | 11/2008 | Chang et al. | |
| 2009/0020272 A1 | 1/2009 | Shimizu | |
| 2009/0025910 A1 | 1/2009 | Hoffman et al. | |
| 2009/0056917 A1 | 3/2009 | Majumdar et al. | |
| 2009/0151906 A1 | 6/2009 | Lai et al. | |
| 2009/0159242 A1 * | 6/2009 | Zhao | B22F 3/11 165/104.26 |
| 2009/0205812 A1 | 8/2009 | Meyer, IV et al. | |
| 2009/0236080 A1 | 9/2009 | Lin et al. | |
| 2009/0294104 A1 | 12/2009 | Lin et al. | |
| 2009/0316335 A1 | 12/2009 | Simon et al. | |
| 2010/0028604 A1 | 2/2010 | Bhushan et al. | |
| 2010/0053899 A1 | 3/2010 | Hashimoto et al. | |
| 2010/0071879 A1 | 3/2010 | Hou | |
| 2010/0084113 A1 | 4/2010 | Lee | |
| 2010/0139767 A1 | 6/2010 | Hsieh et al. | |
| 2010/0157535 A1 | 6/2010 | Oniki et al. | |
| 2010/0200199 A1 | 8/2010 | Habib et al. | |
| 2010/0252237 A1 | 10/2010 | Hashimoto et al. | |
| 2010/0254090 A1 | 10/2010 | Trautman | |
| 2010/0290190 A1 | 11/2010 | Chester et al. | |
| 2010/0294200 A1 | 11/2010 | Zhang et al. | |
| 2010/0300656 A1 | 12/2010 | Lu | |
| 2011/0017431 A1 | 1/2011 | Yang et al. | |
| 2011/0027311 A1 | 2/2011 | Deng et al. | |
| 2011/0083829 A1 | 4/2011 | Hung et al. | |
| 2011/0088873 A1 * | 4/2011 | Yang | F28D 15/0233 165/104.26 |
| 2011/0108142 A1 | 5/2011 | Liu et al. | |
| 2011/0120674 A1 | 5/2011 | MacDonald et al. | |
| 2011/0174474 A1 * | 7/2011 | Liu | C23C 28/30 165/185 |
| 2011/0198059 A1 | 8/2011 | Gavillet et al. | |
| 2011/0205708 A1 | 8/2011 | Andry et al. | |
| 2012/0037210 A1 | 2/2012 | Lim | |
| 2012/0061127 A1 | 3/2012 | Fields et al. | |
| 2012/0168435 A1 | 7/2012 | Chen et al. | |
| 2012/0186784 A1 | 7/2012 | Yang et al. | |
| 2012/0189839 A1 | 7/2012 | Aoki et al. | |
| 2012/0241216 A1 | 9/2012 | Coppeta et al. | |
| 2012/0312504 A1 | 12/2012 | Suzuki et al. | |
| 2013/0043000 A1 | 2/2013 | Wang | |
| 2013/0049018 A1 | 2/2013 | Ramer et al. | |
| 2013/0168057 A1 * | 7/2013 | Semenic | F28D 15/0233 165/104.26 |
| 2013/0199770 A1 | 8/2013 | Cherian | |
| 2013/0269913 A1 | 10/2013 | Ueda et al. | |

(56) References Cited

U.S. PATENT DOCUMENTS

| | | | |
|---|---|---|---|
| 2013/0327504 A1* | 12/2013 | Bozorgi | F28D 15/04 165/104.26 |
| 2014/0009883 A1 | 1/2014 | Fujiwara et al. | |
| 2014/0017456 A1 | 1/2014 | Xiao et al. | |
| 2014/0174700 A1 | 6/2014 | Lin et al. | |
| 2014/0237823 A1 | 8/2014 | Yang | |
| 2014/0238645 A1 | 8/2014 | Enright | |
| 2014/0238646 A1 | 8/2014 | Enright | |
| 2014/0247556 A1 | 9/2014 | Fid et al. | |
| 2015/0181756 A1* | 6/2015 | Sato | B60L 11/1877 165/64 |
| 2015/0226493 A1 | 8/2015 | Yang et al. | |
| 2015/0237762 A1* | 8/2015 | Holt | H05K 7/20336 165/104.21 |
| 2015/0289413 A1* | 10/2015 | Rush | H05K 7/20672 361/700 |
| 2016/0018165 A1* | 1/2016 | Ahamed | F28D 15/0233 165/104.26 |
| 2016/0076820 A1* | 3/2016 | Lewis | F28D 15/0233 165/104.26 |
| 2016/0081227 A1 | 3/2016 | Lee et al. | |
| 2016/0123678 A1* | 5/2016 | Hulse | F28D 15/02 165/104.21 |
| 2016/0131437 A1* | 5/2016 | Wu | F28D 15/04 165/104.26 |
| 2016/0161193 A1* | 6/2016 | Lewis | F28D 15/046 165/104.26 |
| 2016/0216042 A1 | 7/2016 | Bozorgi et al. | |
| 2016/0343639 A1* | 11/2016 | Groothuis | F28D 15/043 |
| 2017/0030654 A1 | 2/2017 | Yang et al. | |
| 2017/0064868 A1* | 3/2017 | Rush | H05K 7/20336 |
| 2017/0122672 A1 | 5/2017 | Lin | |
| 2017/0241717 A1 | 8/2017 | Sun et al. | |
| 2017/0318702 A1 | 11/2017 | Basu et al. | |
| 2017/0343293 A1 | 11/2017 | Urbi et al. | |
| 2017/0350657 A1 | 12/2017 | Yeh et al. | |
| 2018/0320984 A1 | 11/2018 | Lewis | |
| 2019/0390919 A1 | 12/2019 | Lewis et al. | |
| 2020/0003501 A1 | 1/2020 | Wakaoka | |

FOREIGN PATENT DOCUMENTS

| | | |
|---|---|---|
| CN | 1877241 A | 12/2006 |
| CN | 1957221 A | 5/2007 |
| CN | 101022718 A | 8/2007 |
| CN | 101080359 A | 11/2007 |
| CN | 101151950 A | 3/2008 |
| CN | 100480611 C | 4/2009 |
| CN | 100508708 C | 7/2009 |
| CN | 101754656 A | 6/2010 |
| CN | 102019543 A | 4/2011 |
| CN | 102066864 A | 5/2011 |
| CN | 202928418 U | 5/2013 |
| CN | 103398613 A | 11/2013 |
| DE | 19729922 C1 | 1/1999 |
| DE | 202009016739 U1 | 4/2010 |
| EP | 1369918 A2 | 12/2003 |
| EP | 2713132 A1 | 4/2014 |
| GB | 2529512 A | 2/2016 |
| JP | H1197871 A | 4/1999 |
| JP | 2011080679 A | 4/2011 |
| JP | 2013148289 A | 8/2013 |
| WO | 03103835 A1 | 12/2003 |
| WO | 2006052763 A2 | 5/2006 |
| WO | 2006115326 A1 | 11/2006 |
| WO | 2007124028 A2 | 11/2007 |
| WO | 2008044823 | 4/2008 |
| WO | 2008044823 A1 | 4/2008 |
| WO | 2008045004 A1 | 4/2008 |
| WO | 2008146129 A2 | 12/2008 |
| WO | 2009079084 A1 | 6/2009 |
| WO | 2010036442 A1 | 4/2010 |
| WO | 2013144444 | 10/2013 |
| WO | 2015172136 A1 | 11/2015 |
| WO | WO 2016044180 A1 * | 3/2016 ......... H05K 7/20509 |

OTHER PUBLICATIONS

International Search Report and Written Opinion dated Jan. 17, 2018 in related PCT Application No. PCT/US2017/060550 (11 pages).

International Search Report and Written Opinion, as issued in connection with International Patent Application No. PCT/US2015/050031, dated Dec. 18, 2015, 10 pgs.

International Search Report and Written Opinion, as issued in connection with International Patent Application No. PCT/US2015/050771, dated Dec. 18, 2015, 8 pgs.

U.S. Office Action in U.S. Appl. No. 12/719,775, dated Nov. 9, 2012, 15 pgs.

U.S. Office Action in U.S. Appl. No. 12/719,775, dated May 9, 2013, 15 pgs.

U.S. Office Action in U.S. Appl. No. 12/719,775, dated Oct. 2, 2013, 15 pgs.

U.S. Office Action in U.S. Appl. No. 12/719,775, dated Mar. 26, 2014, 23 pgs.

U.S. Office Action in U.S. Appl. No. 12/719,775, dated Feb. 6, 2015, 24 pgs.

U.S. Notice of Allowance in U.S. Appl. No. 12/719,775, dated Aug. 4, 2015, 8 pgs.

U.S. Office Action in U.S. Appl. No. 14/681,624, dated Oct. 23, 2015, 11 pgs.

International Search Report and Written Opinion dated Jul. 15, 2016 in related PCT Application No. PCT/US2015/57885 (11 pages).

U.S. Office Action in U.S. Appl. No. 14/681,624, dated May 5, 2016, 10 pgs.

U.S. Notice of Allowance in U.S. Appl. No. 14/681,624, dated Nov. 17, 2016, 7 pgs.

U.S. Office Action in U.S. Appl. No. 14/925,787, dated Aug. 9, 2017, 15 pgs.

U.S. Office Action in U.S. Appl. No. 14/925,787 dated Sep. 28, 2017, 9 pages.

U.S. Restriction Requirement in U.S. Appl. No. 14/853,833 dated Aug. 30, 2017, 7 pages.

International Search Report and Written Opinion dated Jul. 15, 2016 in related PCT Application No. PCT/US2015/057885 (11 pages).

U.S. Notice of Allowance in U.S. Appl. No. 14/925,787, dated Nov. 9, 2017, 7 pgs.

U.S. Office Action in U.S. Appl. No. 14/853,833 dated Oct. 6, 2017, 12 pages.

U.S. Office Action in U.S. Appl. No. 14/857,567 dated Nov. 21, 2017, 11 pages.

U.S. Office Action in U.S. Appl. No. 14/861,708 dated May 9, 2017, 8 pages.

U.S. Notice of Allowance in U.S. Appl. No. 14/861,708 dated Oct. 25, 2017, 9 pages.

U.S. Office Action in U.S. Appl. No. 15/292,932 dated Dec. 11, 2018, 12 pages.

U.S. Office Action in U.S. Appl. No. 14/857,567 dated Aug. 2, 2018, 29 pages.

U.S. Restriction Requirement in U.S. Appl. No. 15/436,632 dated Oct. 10, 2018, 5 pages.

U.S. Restriction Requirement in U.S. Appl. No. 15/292,932 dated Aug. 30, 2018, 5 pages.

U.S. Office Action in U.S. Appl. No. 14/857,567 dated Oct. 30, 2018, 27 pages.

U.S. Office Action in U.S. Appl. No. 14/853,833 dated Nov. 19, 2018, 11 pages.

U.S. Office Action in U.S. Appl. No. 14/853,833 dated Apr. 25, 2018, 11 pages.

International Search Report and Written Opinion, as issued in connection with International Patent Application No. PCT/US2018/31632, dated Oct. 15, 2018, 16 pgs.

U.S. Office Action in U.S. Appl. No. 15/806,723 dated Apr. 5, 2019, 11 pages.

(56) References Cited

OTHER PUBLICATIONS

U.S. Office Action in U.S. Appl. No. 14/857,567 dated Mar. 21, 2019, 27 pages.
U.S. Office Action in U.S. Appl. No. 14/853,833 dated Mar. 29, 2019, 27 pages.
U.S. Office Action in U.S. Appl. No. 15/292,932 dated Mar. 29, 2019, 13 pages.
U.S. Office Action in U.S. Appl. No. 15/436,632 dated Feb. 5, 2019, 9 pages.
U.S. Office Action in U.S. Appl. No. 15/787,455 dated Apr. 1, 2019, 19 pages.
Non-Final Office Action dated Oct. 5, 2021 in U.S. Appl. No. 16,680/480, 12 pages.
Third Office Action mailed Apr. 19, 2021, as received in CN Application No. 201580049534, 7 pages.
Non-Final Office Action dated May 11, 2021 in U.S. Appl. No. 16/539,848, 10 pages.
Non-Final Office Action dated May 17, 2021 in U.S. Appl. No. 15/974,306, 9 pages.
International Preliminary Report on Patentability dated Jun. 8, 2021 as received in PCT Application No. PCT/JS2019/065701, 7 pages.
Restriction Requirement dated Jun. 9, 2021 in U.S. Appl. No. 16/680,480, 6 pages.
Non-Final Office Action dated Jul. 9, 2021 in U.S. Appl. No. 15/930,016, 18 pages.
Restriction Requirement dated Jul. 19, 2021 in U.S. Appl. No. 16/710,180, 7 pages.
Restriction Requirement dated Aug. 30, 2021 in U.S. Appl. No. 17/352,250, 7 pages.
Notice of Allowance dated Sep. 9, 2021 in U.S. Appl. No. 15/787,455, 8 pages.
Restriction Requirement dated Jul. 23, 2012 in U.S. Appl. No. 12/719,775, 9 pages.
Advisory Action dated Aug. 2, 2013 in U.S. Appl. No. 12/719,775, 4 pages.
Advisory Action dated Jun. 20, 2014 in U.S. Appl. No. 12/719,775, 4 pages.
Restriction Requirement dated Jul. 28, 2015 in U.S. Appl. No. 14/681,624, 5 pages.
International Preliminary Report on Patentability dated Mar. 21, 2017 as received in PCT Application No. PCT/US2015/050031, 8 pages.
International Preliminary Report on Patentability dated Mar. 21, 2017 as received in PCT Application No. PCT/JS2015/050771, 6 pages.
International Preliminary Report on Patentability dated May 2, 2017 as received in PCT Application No. PCT/US2015/057885, 5 pages.
Extended European search report Application mailed Feb. 22, 2018, as received in EP Application No. 15842101.6, 7 pages.
Final Office Action dated Mar. 8, 2018 in U.S. Appl. No. 14/857,567, 25 pages.
Extended European search report mailed Mar. 26, 2018, as received in EP Application No. 15841403.7, 10 pages.
First Office Action mailed May 9, 2018, as received in CN Application No. 201580049534, 13 pages.
Advisory Action dated May 30, 2018 in U.S. Appl. No. 14/857,567, 7 pages.
First Office Action mailed Aug. 28, 2018, as received in CN Application No. 201580059333, 10 pages.
Second Office Action mailed Dec. 29, 2018, as received in CN Application No. 201580049534, 14 pages.
International Preliminary Report on Patentability dated May 14, 2019 as received in PCT Application No. PCT/JS2017/060550, 7 pages.
Final Office Action dated May 28, 2019 in U.S. Appl. No. 15/436,632, 14 pages.
Advisory Action dated Jul. 19, 2019 in U.S. Appl. No. 15/292,932, 4 pages.
Final Office Action dated Aug. 26, 2019 in U.S. Appl. No. 14/857,567, 27 pages.
Notice of Allowance dated Sep. 12, 2019 in U.S. Appl. No. 15/292,932, 7 pages.
Notice of Allowance dated Oct. 10, 2019 in U.S. Appl. No. 15/436,632, 10 pages.
Final Office Action dated Oct. 11, 2019 in U.S. Appl. No. 15/806,723, 18 pages.
Advisory Action dated Nov. 7, 2019 in U.S. Appl. No. 14/857,567, 7 pages.
International Preliminary Report on Patentability dated Nov. 12, 2019 received in PCT Application No. PCT/JS2018/031632, 7 pages.
Non-Final Office Action dated Nov. 29, 2019 in U.S. Appl. No. 14/857,567, 32 pages.
Advisory Action dated Feb. 3, 2020 in U.S. Appl. No. 15/806,723, 5 pages.
Restriction Requirement dated Feb. 13, 2020 in U.S. Appl. No. 15/974,306, 5 pages.
Office Action mailed Feb. 18, 2020, as received in EP Application No. 15841403.7, 4 pages.
Non-Final Office Action dated Mar. 18, 2020 in U.S. Appl. No. 15/806,723, 6 pages.
International Search Report and Written Opinion dated Apr. 8, 2020 as received in PCT Application No. PCT/US2019/065701, 16 pages.
Office Action mailed Apr. 9, 2020, as received in EP Application No. 15842101.6, 7 pages.
Notice of Allowance dated Apr. 15, 2020 in U.S. Appl. No. 14/857,567, 13 pages.
Notice of Allowance dated Apr. 20, 2020 in U.S. Appl. No. 15/806,723, 8 pages.
Non-Final Office Action dated May 29, 2020 in U.S. Appl. No. 15/974,306, 11 pages.
First Office Action received Jun. 1, 2020, in related CN application No. 201910233277.1, 18 Pages.
First Office Action mailed Jun. 4, 2020, as received in CN Application No. 201580050472, 15 pages.
Extended European search report Application mailed Jun. 12, 2020, as received in EP Application No. 17870153.8, 9 pages.
International Search Report and Written Opinion Application mailed Jul. 13, 2020, as received in PCT Application No. PCT/US2020/030911, 9 pages.
First Office Action mailed Jul. 24, 2020, as received in CN Application No. 201910754250, 19 pages.
First Office Action mailed Sep. 24, 2020, as received in CN Application No. 201880030856, 19 pages.
Restriction Requirement dated Oct. 14, 2020 in U.S. Appl. No. 16/539,848, 8 pages.
Non-Final Office Action dated Oct. 26, 2020 in U.S. Appl. No. 16/539,848, 13 pages.
Office Action mailed Nov. 18, 2020, as received in EP Application No. 15841403.7, 5 pages.
Office Action mailed Nov. 17, 2020, as received in EP Application No. 15842101.6, 5 pages.
Extended European search report Application mailed Dec. 16, 2020, as received in EP Application No. 18798835.7, 8 pages.
Final Office Action dated Jan. 11, 2021 in U.S. Appl. No. 15/974,306, 12 pages.
Final Office Action dated Feb. 2, 2021 in U.S. Appl. No. 16/539,848, 10 pages.
Second Office Action mailed Mar. 16, 2021, as received in CN Application No. 201910233277.1, 21 pages.
Advisory Action dated Apr. 9, 2021 in U.S. Appl. No. 16/539,848, 4 pages.
Restriction Requirement dated Apr. 9, 2021 in U.S. Appl. No. 16/710,180, 8 pages.
Advisory Action dated Apr. 16, 2021 in U.S. Appl. No. 15/974,306, 4 pages.
International Search Report and Written Opinion in PCT Application No. PCT/US2021/038152 mailed on Sep. 29, 2021, 14 pages.
Non-Final Office Action in U.S. Appl. No. 16/710,180 dated Dec. 13, 2021, 14 pages.

* cited by examiner

METHOD AND DEVICE FOR OPTIMIZATION OF VAPOR TRANSPORT IN A THERMAL GROUND PLANE USING VOID SPACE IN MOBILE SYSTEMS

SUMMARY

Some embodiments of the invention include a thermal ground plane with a variable thickness vapor core. For example, a thermal ground plan may include a first casing and a second casing where the second casing and the first casing configured to enclose a working fluid. The thermal ground plane may also include an evaporator region disposed at least partially on at least one of the first casing and the second casing; a condenser region disposed at least partially on at least one of the first casing and the second casing; and a wicking layer disposed between the first casing and the second casing a vapor core defined at least partially by a gap between the first casing and the second casing. The thickness of the gap can vary across the first casing and the second casing.

In some embodiments, the gap may be optimally designed to provide space for enlarging the gap of the vapor core.

In some embodiments, a gap adjacent with the evaporator region has a thickness less than the average gap thickness.

In some embodiments, a gap nonadjacent to the evaporator region has a thickness greater than the average gap thickness.

In some embodiments, either or both the first casing and the second casing comprise a material that stretches and/or contracts enlarging the gap.

In some embodiments, the thermal ground plane may include a plurality of spacers disposed within the gap.

In some embodiments, the wicking layer may be in contact with either or both the first casing layer and/or the second casing.

In some embodiments, the thermal ground plane may include an additional wicking material in contact with wicking layer and the evaporator region.

In some embodiments, the plurality of spacers may comprise copper or a polymer encapsulated by a hermetic seal.

In some embodiments, the plurality of spacers may comprise springs.

In some embodiments, the plurality of spacers may comprise elastic material.

In some embodiments, the gap may have a thickness less than 50 µm.

In some embodiments, the gap may be defined by an internal pressure that is higher than an ambient pressure These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

A thermal ground plane is disclosed that includes a variable thickness vapor core. In some embodiments, the thickness of the vapor core may correspond with three-dimensional shape of circuit elements and/or a device casing within which the thermal ground plane may be placed. A method for manufacturing a thermal ground plane with a variable thickness vapor core is also disclosed.

Figure 1:
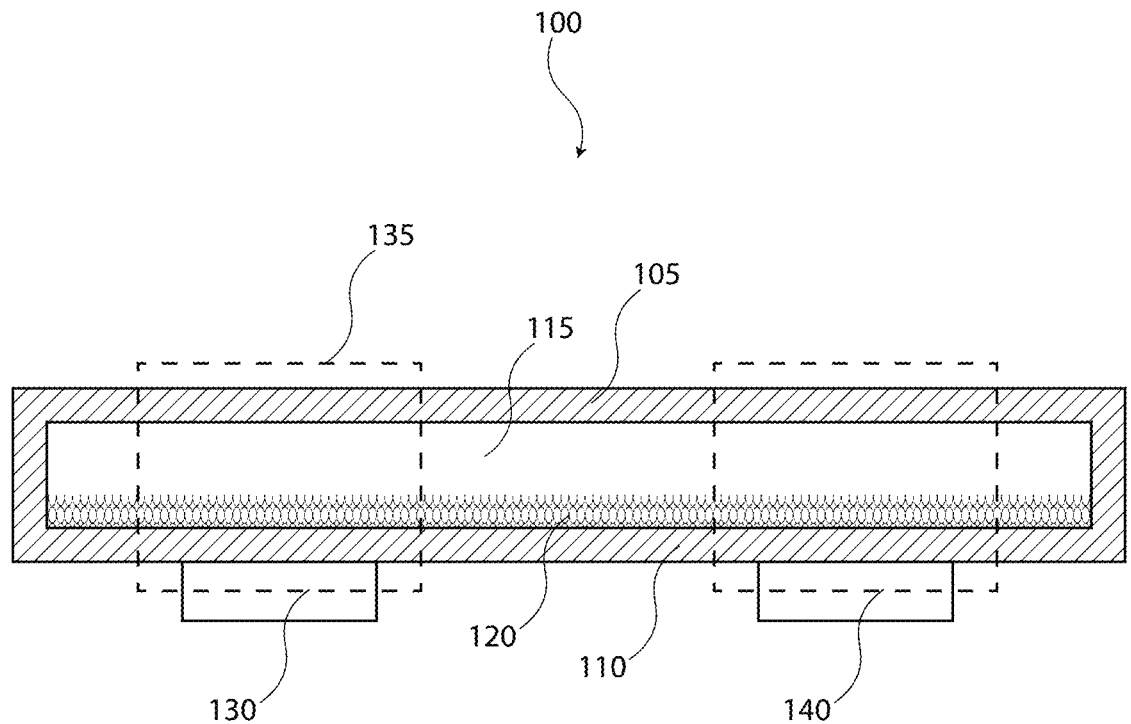
FIG. 1 is a diagram of an example thermal ground plane according to some embodiments.

An example thermal ground plane is shown in FIG. 1. Water or other coolant can be enclosed within the thermal ground plane. The thermal ground plane, for example, may transfer heat from a heat source, e.g. chip, to a heat sink, for example, through the following mechanisms: a) evaporation of water by absorption of heat dissipated from the chip and form vapor; b) vapor transport from hot evaporator region to cold condenser regions; c) condensation from vapor to liquid with cooling provided by heat sinks; and/or d) return of liquid from condenser to evaporator through capillary pumping pressure resulting from a wicking structure. In some embodiments, a thermal ground plane's thermal performance can be about 3-50× higher than that of copper. In some embodiments, a thermal ground plane's thermal performance can be dependent on the configuration.

In some embodiments, there can be several thermal resistances associated with the operation of a thermal ground plane. For example, thermal resistances may include: a) thermal resistance (Re, cladding) through the casing of the thermal ground plane in the evaporator region; b) thermal resistance (Re, mesh) through the wicking structure, e.g. copper mesh, with water contained in the evaporator region; c) thermal resistance (Ra, vapor) of vapor transport from the evaporator to the condenser through the vapor core; d) thermal resistance (Rc, mesh) through the wicking structure with water contained in the condenser region; e) thermal resistance (Rc, cladding) through the casing of the thermal ground plane in the condenser region; f) thermal resistance (Ra, mesh) of heat conduction from the condenser to the evaporator along the wicking structure with water contained; and/or g) thermal resistance (Ra, cladding) of heat conduction from the condenser to the evaporator along the casing.

For a thick thermal ground plane (e.g., thicknesses greater than or equal to about 1 mm) the gap (or height) of the vapor core is large. As a result, vapor can be transported through the vapor core without much flow resistance and/or the thermal resistance (Ra, vapor) of the vapor transport may be negligible. However, for a thin thermal ground plane (e.g., thicknesses less than about 1 mm) (or, e.g., thicknesses 0.25 mm-0.35 mm) the gap (or height) of the vapor core is reduced substantially. Thermal resistance (Ra, vapor) of the vapor transport may, in some cases, play a dominant role. The total thermal performance of such a thin thermal ground plane can be dependent on the performance of the vapor transport.

Figure 2:
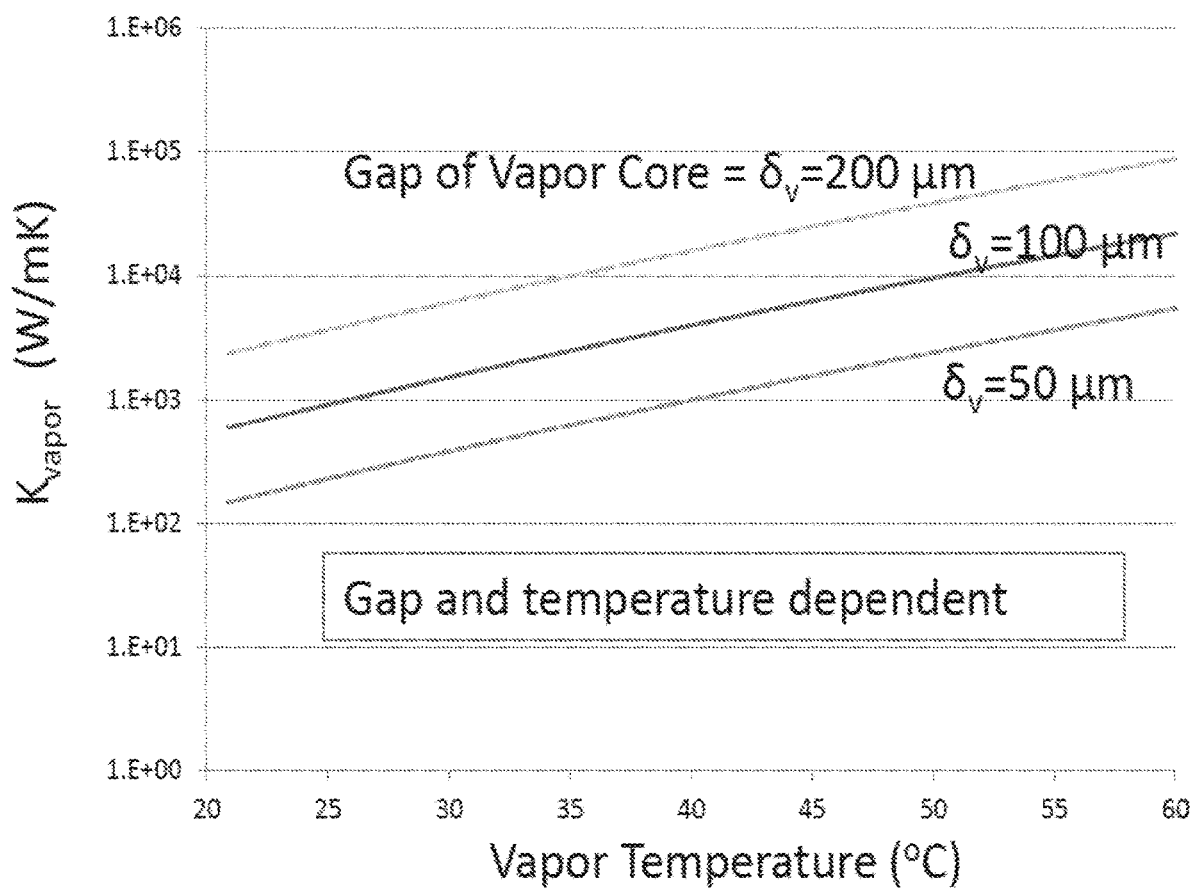
FIG. 2 is a graph illustrating effective thermal conductivities of vapor transport of a 0.25 mm thin thermal ground plane according to some embodiments.

The thermal performance of the vapor transport can be represented, for example, by an effective thermal conductivity of the vapor transport. As shown in FIG. 2, the effective thermal conductivity of such transport may be affected by the gap of the vapor core and/or the vapor temperatures. For example, with 45° C. vapor, its effective thermal conductivity could be reduced from 30,000 W/mK to 7,000 W/mK when the gap is decreased from 200 µm to 100 µm. It may be further reduced, for example, from 7,000 to 2,000 W/mK when the gap is decreased from 100 µm to 50 µm. A gap, for example, varying by 50 µm or 100 µm could result in significant variations in thermal performance of the vapor transport.

For mobile systems, e.g. smartphones, tablets, watches, wearable devices, and laptops, and/or wearable electronics, thickness can be important. Every 50 µm or 100 µm space has to be considered seriously during the design phase. Some embodiments of the invention may introduce a variable thickness vapor core for a thermal ground plane. In some embodiments, the variable thickness of the thermal ground plane may coincide with void spaces in the mobile system.

Void space exist in almost every smartphone, tablet, laptop or wearable electronics device. In some embodiments, the void spaces can be used to provide thicker vapor cores within a thermal ground plane that may be used to enhance vapor transport.

For example, shows a number of void spaces are created from the different heights of the components in an iPhone 4's circuit board. Such void space can be used to enhance vapor transport of a thermal ground plane to be used to spread heat from chips to the case of the phone. Similar void space also exists in other regions inside a mobile system.

In some embodiments, void space in the casing can also be used to optimize vapor transport of a thermal ground plane.

A typical thermal ground plane is shown in FIG. 1; it is flat. Vapor core might be designed for the optimum performance under such a flat configuration. In some embodiments, the thermal ground plane's vapor core and other layers of materials can vary and may use the void space available. For a thin thermal ground plane, the temperature difference across its thickness is small in most of cases. Therefore, it may not be critical to have a wicking structure attached to the hot chips directly. Without the wicking layer attached to the chips, the manufacturing of the varying vapor core and its associated case may be easier.

The vapor core with varying gaps can be fabricated by using stamping or other shape forming processes. The varying gaps can also be formed by pressurizing the vapor core and deform the casing against the circuit board. In this embodiment, the casing may be compliant and/or plastic. After the shape forming process, the thermal ground plane casing(s) can be strengthened.

As shown in FIG. 2, a 50 µm or 100 µm increase in a section of vapor core can effectively improve vapor transport within the thermal ground plane. This figure also indicates the vapor transport is strongly affected by the vapor temperatures. As a result, the impact of the enhancement will be substantial in sections far away from the hot chips. In those sections, the vapor temperatures are lower and result in poor vapor transport. These sections are the ones that may benefit from any enhancement.

Figure 3:
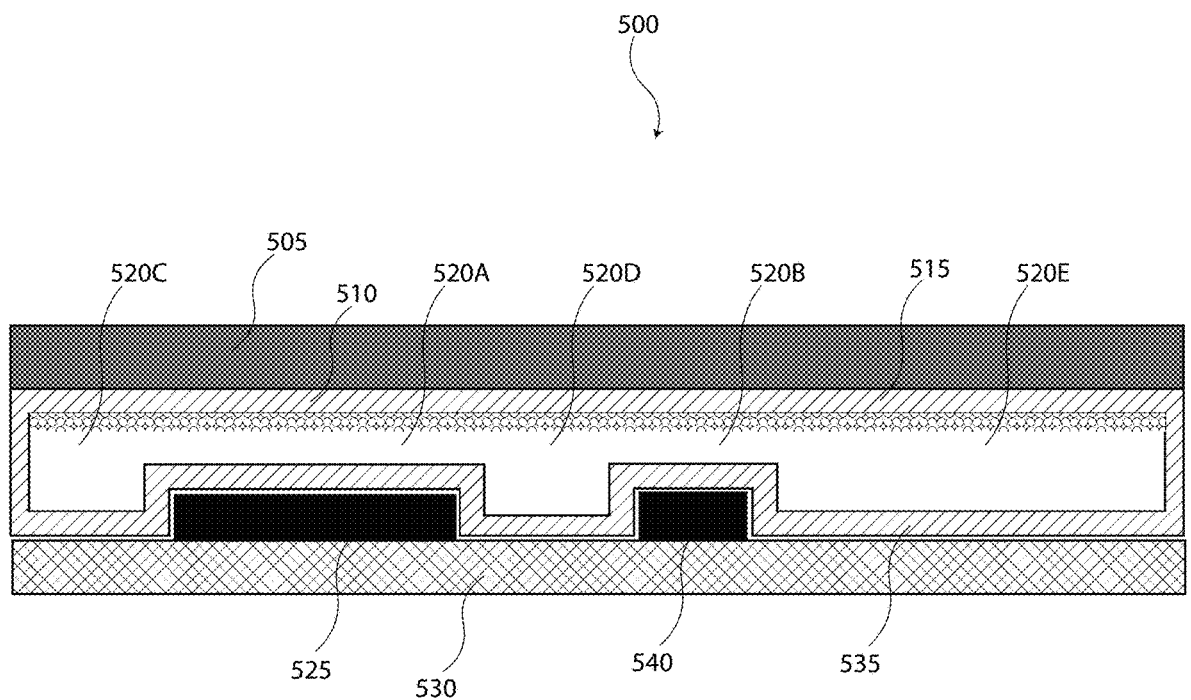
FIG. 3 is a side view of a thermal ground plane that includes a variable thickness vapor core according to some embodiments.

FIG. 3 is a side view of a thermal ground plane 500 that includes a variable thickness vapor core 520 according to some embodiments. In some embodiments, thermal ground plane 500 includes first casing 510 (e.g., first casing) and second casing 535 (e.g., second casing). The first casing 510 and the second casing 535 may be sealed together enclosing the other components of thermal ground plane 500. The thermal ground plane 500 may also include a wicking structure 515 and vapor core 520. The wicking structure 515 may be coupled with, attached to, touching, deposited on, etc. the first casing 510. In some embodiments, the wicking structure 515 can be made from copper, stainless steel, titanium, ceramics, or polymer. In some embodiments, the wicking structure may include or be coated with an additional layer to protect it from reactions with fluid if needed.

In some embodiments, the thermal ground plane 500 may be disposed between circuit board 530 having circuit elements 525 and 540, and a device shell 505. In this example, the circuit board 530 with the circuit elements 525 and 540 has a variable height. The second casing 535 may have a variable shape that accommodates the variable shape of the circuit board 530 and the circuit elements 525 and 540 (e.g., a processor, memory, integrated circuit, etc. The variable shape of the second casing 535 products a vapor core 530 having a variable thickness. As shown in the figure, the thickness of the vapor core 530 varies whether the vapor core 520 is near a circuit element 525 or 540.

In some embodiments, the variable width vapor core may enhance vapor transport within the thermal ground plane 500.

In some embodiments, an evaporator region may be formed near the circuit element 525 or 540. In some embodiments, a condenser region may be formed nonadjacent from the circuit element 525 or 540.

As shown in FIG. 3, the vapor core 520 may be thicker in portions of the thermal ground plane corresponding to void spaces in the circuit board. In some embodiments, different portions of the vapor core may have different thicknesses. In some embodiments, the second casing 535 of the thermal ground plane 500 may have a contoured shape, a three-dimensional shape, a varied shape, a non-planar shape, etc. In some embodiments, a wicking structure 515 and/or the first casing 510 of the thermal ground plane 500 may be substantially flat. In some embodiments, both the first casing 510 and the second casing 535 of the thermal ground plane 500 may have a contoured shape, a three-dimensional shape, varied shape, a non-planar shape, etc.

In some embodiments, an evaporator region may be disposed at least partially on either the first casing 510 and/or the second casing 535. An evaporator region, for example, may be designed within either the first casing 510 and/or the second casing 535 such that in use the evaporator region may be disposed near a heat source, for example, near one or more circuit elements 525 and 540.

In some embodiments, a condenser region may be disposed at least partially on either the first casing 510 and/or the second casing 535. A condenser region, for example, may be designed within either the first casing 510 and/or the second casing 535 such that in use the condenser region may be disposed near a region likely to be cooler than the heat source.

The vapor core 520 includes two thinner vapor core regions 520A and 520B; and three thicker vapor core regions 520C, 520D, and 520E. In some embodiments, the vapor core regions 520A and 520B may have a thickness that is less than the average vapor core thickness. In some embodiments, the vapor core regions 520C, 520D, and 520E may have a thickness that is more than the average vapor core thickness. In some embodiments, one or more of the vapor core regions 520A and 520B may have a thickness less than about 50-100 μm. In some embodiments, one or more of the vapor core regions 520C, 520D, and 520E may have a thickness greater than about 50-100 μm.

Figure 4A:
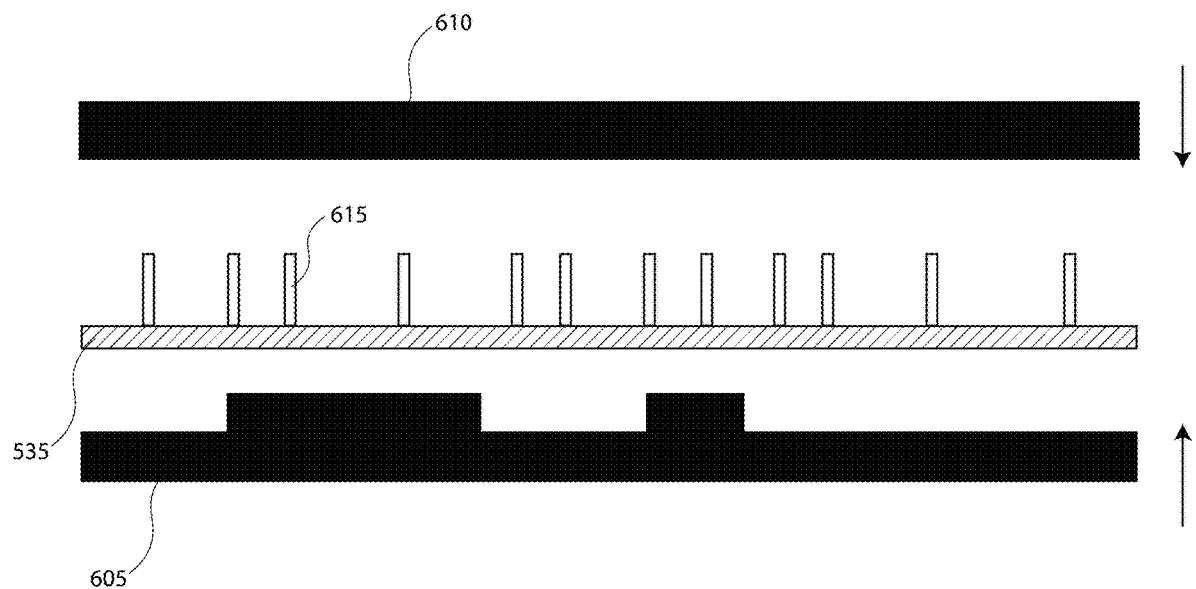
FIG. 4A, FIG. 4B, FIG. 5A, and FIG. 5B illustrate steps for fabricating a thermal ground plane with a variable thickness vapor core according to some embodiments.

FIG. 4A, FIG. 4B, FIG. 5A, and FIG. 5B illustrate steps for fabricating a thermal ground plane with a variable thickness vapor core according to some embodiments. In FIG. 4A, for example, a plurality of spacers 615 may be disposed or fabricated on a second casing 535. The plurality of spacers 615 may be disposed on the second casing 535, for example, by electroplating, metal etching, polymer deposition, photolithography, vapor deposition, etc. In some embodiments, the plurality of spaces may be hermetic sealed or coated with a corrosion resistance coating.

Figure 4B:
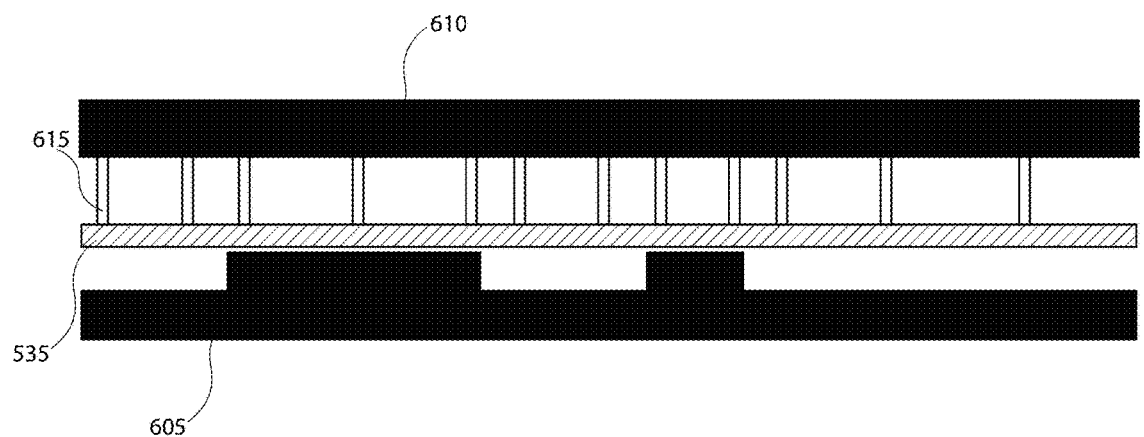
Figure 5A:
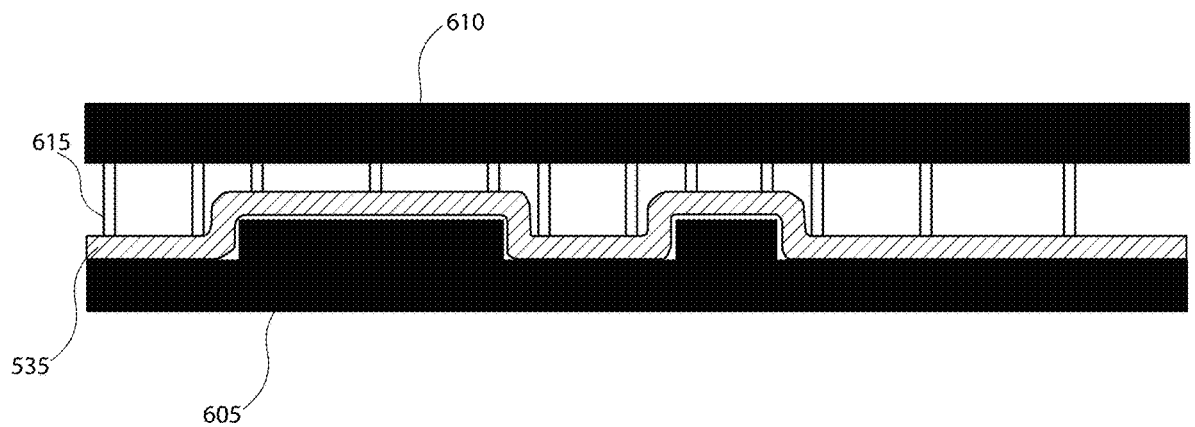

In FIG. 4B and FIG. 5A, for example, the second casing 535 and the plurality of spacers 615 may be pressed against a shape forming base plate 605 using, for example, a shape forming top plate 610. For example, the shape forming base plate 605 may have a three-dimensional form, shape, or model of the circuit board 530 with the circuit elements 525 and 540. In some embodiments, the shape of the shape forming base plate 605 may be defined by the void space of the circuit board.

Figure 5B:
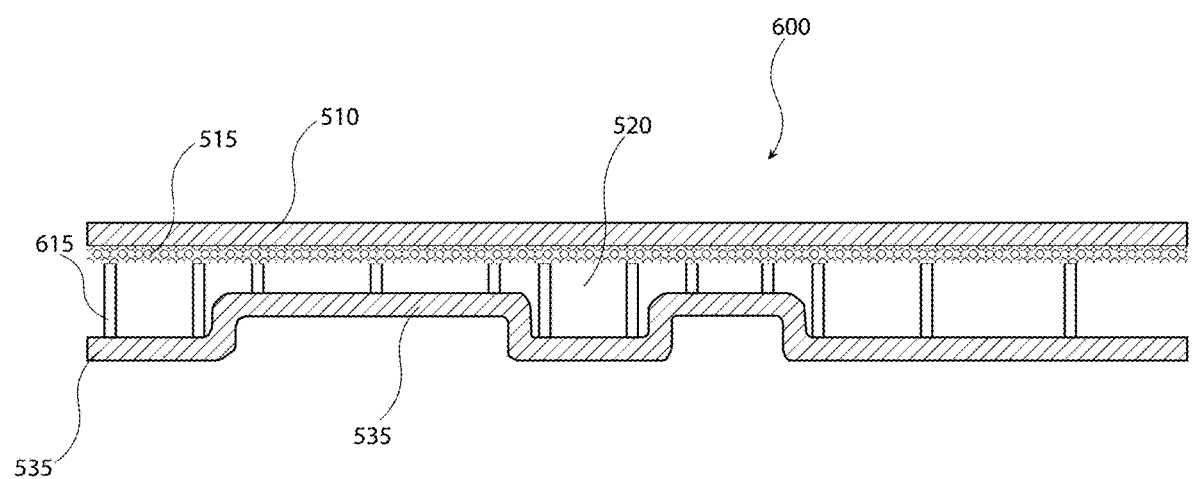

FIG. 5B illustrates a thermal ground plane 600 with a permanently deformed second casing 535 and a plurality of spacers 615 integrated with other layers. In this example, a wicking structure 515 is in contact, coupled with, disposed on, grown upon, etc. the first casing 510. In this example, the first casing 510 may be flat. In this example, the thermal ground plane 600 includes a vapor core with a variable thickness. In some embodiments, gas within the thermal ground plane 600 can be removed before water or other coolant is charged into the thermal ground plane 600. Various other steps may include sealing the first casing 510 with the second casing 535, charging the thermal ground plane 600, coating one or more layers of the thermal ground plane 600, etc. In some embodiments, the pressure of water vapor inside thermal ground plane 600 can be lower than atmospheric pressure during normal operation. The lower pressure, for example, may cause one or both of the thermal ground plane casings and/or other layers are pulled against the spacers used to define the vapor core. In some embodiments, various steps of forming the thermal ground plan 600 may be accomplished by a shape forming step using a set of fixtures. In some embodiments, various steps of forming the thermal ground plan 600 may be accomplished by a roll-to-roll shape forming process.

Various other techniques may be used to shape the height of the plurality of spacers 615. For example, some of the spacers of the plurality of spacers 615 may be etched away using photolithography techniques. In some embodiments, spacers can be fabricated with a non-uniform distribution of heights, so no deformations of the spacers are needed. In some embodiments, the second casing 535 may be formed with a required shape, followed by spacers fabricated on the second casing 535 formed. In some embodiments, the spacer layer can be a continuous mesh layer or a porous layer. This single layer can consist of two sublayers or multiple sublayers.

In some embodiments, the plurality of spacers 615 may comprise a copper or polymer material. In some embodiments, the plurality of spacers may include any type of metal.

Figure 6A:
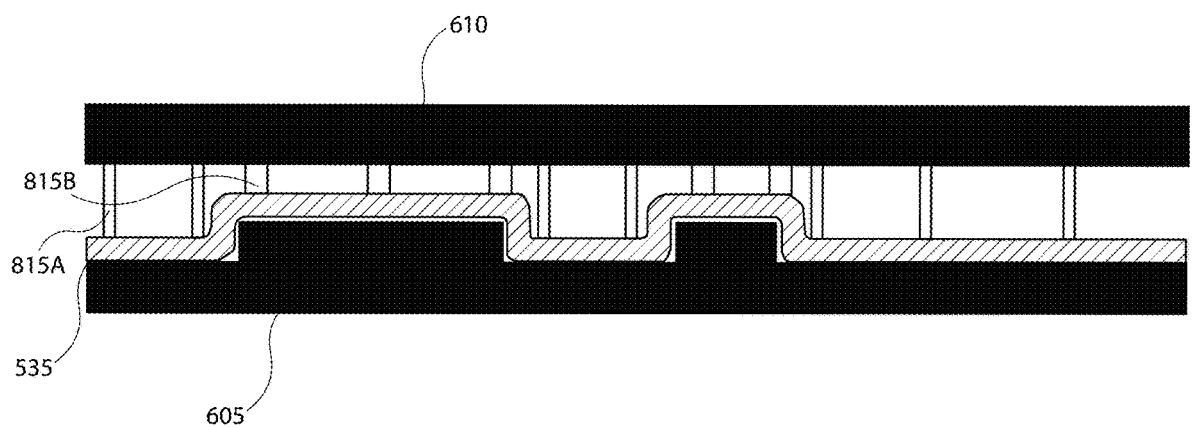
FIG. 6A and FIG. 6B illustrate a thermal ground plane with a first portion of the plurality of spacers that having an expanded thickness and/or short height.
Figure 6B:
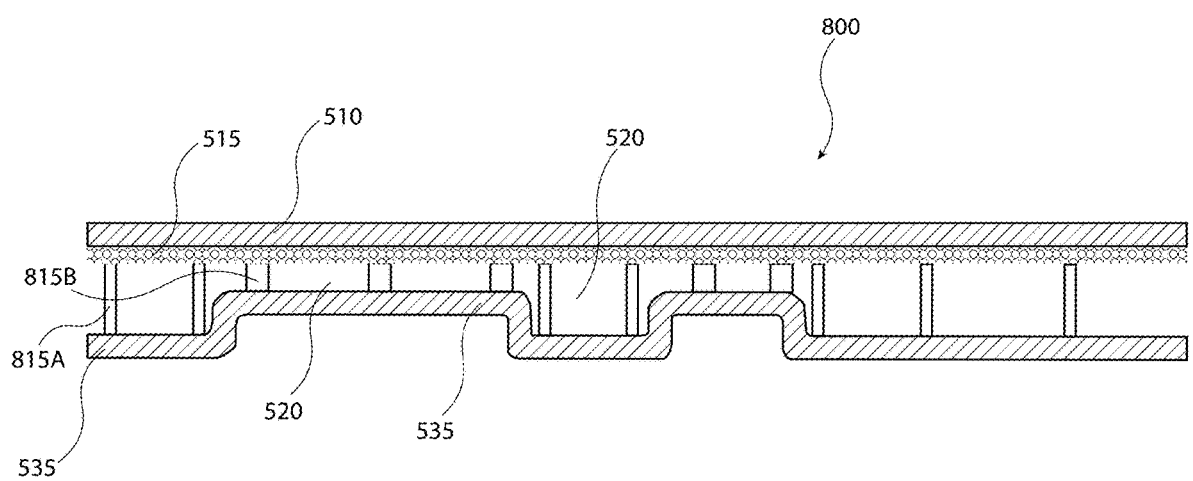
Figure 7A:
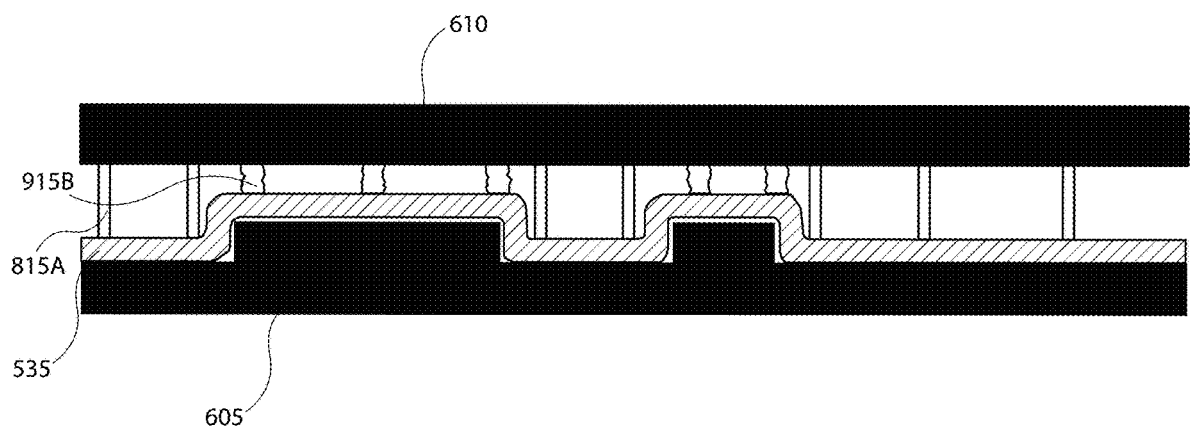
FIGS. 7A and 7B illustrate a thermal ground plane with the first portion of the plurality of spacers that having an expanded thickness and/or short height with a crumpled or crushed profile
Figure 7B:
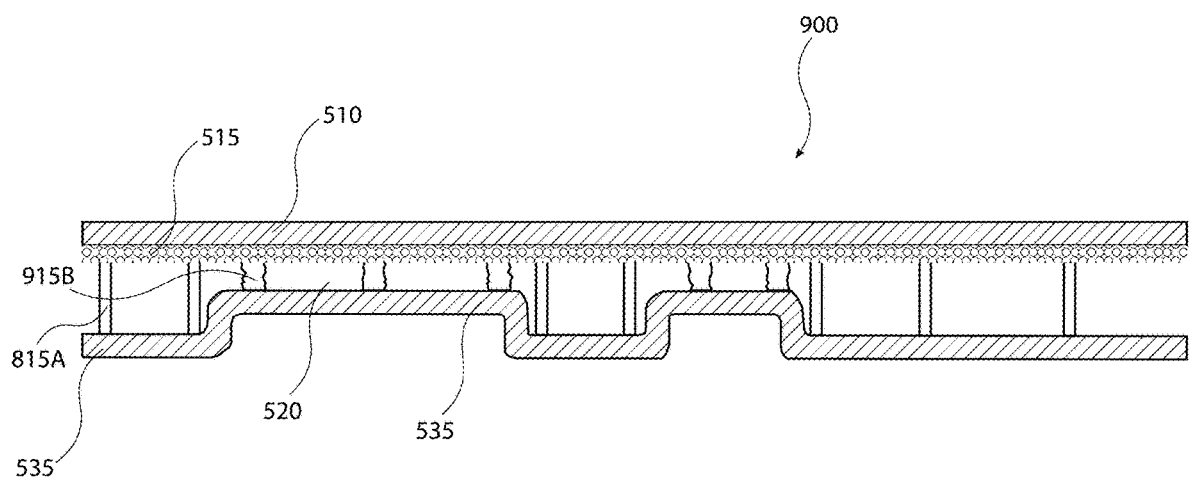

FIG. 6A and FIG. 6B illustrate a thermal ground plane 800 with a first portion of the plurality of spacers 815B that having an expanded thickness and/or short height. The thermal ground plane 800 may also have a second portion of the plurality of spacers 815A that may not have an expanded thickness and/or may have a taller height. The first portion of the plurality of spacers 815B may be disposed in portions of the vapor core 520 with a first thickness; and the second portion of the plurality of spacers 815A may be disposed in portions of the vapor core 520 with a second thickness. The first thickness may be smaller than the second thickness. In some embodiments, the first portion of the plurality of spacers 815B with the expanded thickness and/or the short height may be expanded from compression. FIGS. 7A and 7B illustrate a thermal ground plane 800 with the first portion of the plurality of spacers 915B that having an expanded thickness and/or short height with a crumpled or crushed profile that may be caused by compression of the thermal ground plane 900.

In some embodiments, the mesh structure 515 may be disposed on the plurality of spacers 815A, 815B, and/or 915B, and/or in between the plurality of spacers 815A, 815B, and/or 915B and the first casing 510.

Figure 8:
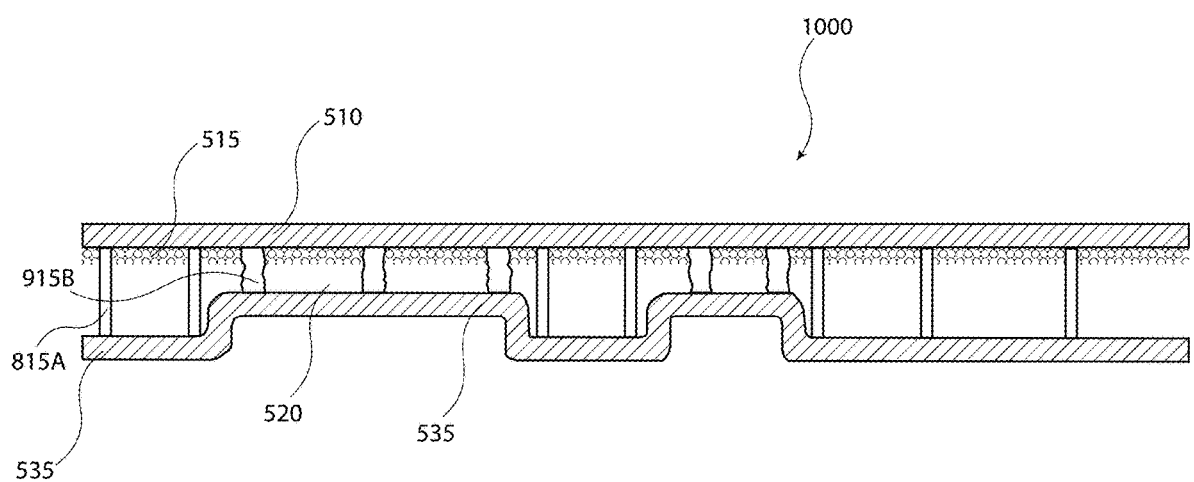
FIG. 8 illustrates thermal ground plane according to some embodiments.
Figure 9A:
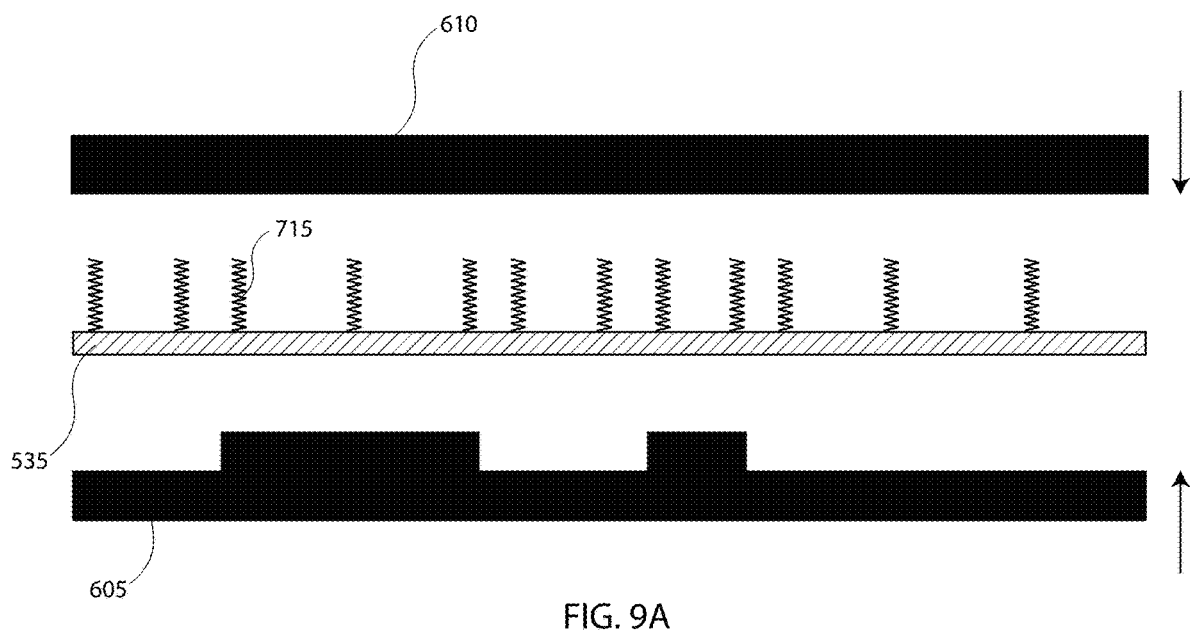
FIG. 9A, FIG. 9B, FIG. 10A, and FIG. 10B illustrate steps for fabricating a thermal ground plane with a variable thickness vapor core according to some embodiments.
Figure 9B:
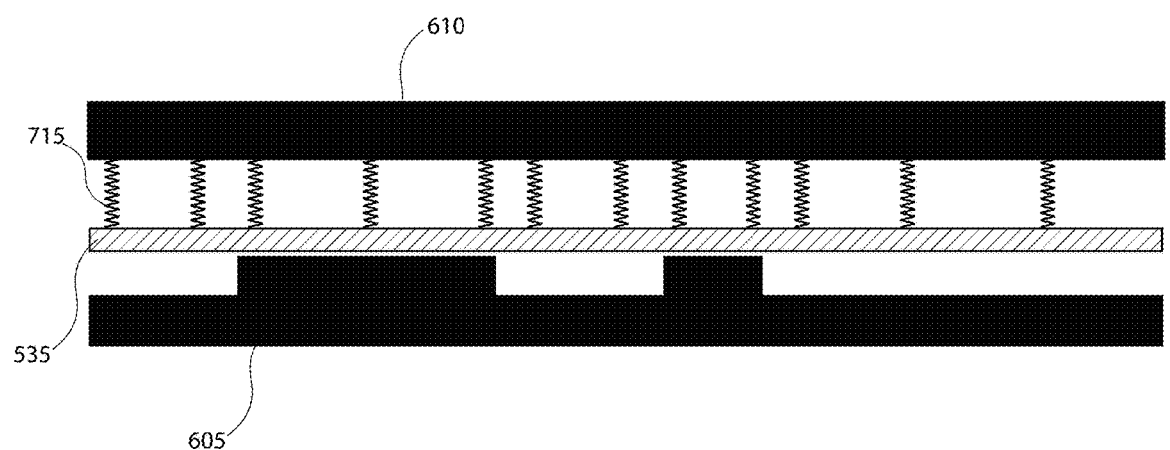
Figure 10A:
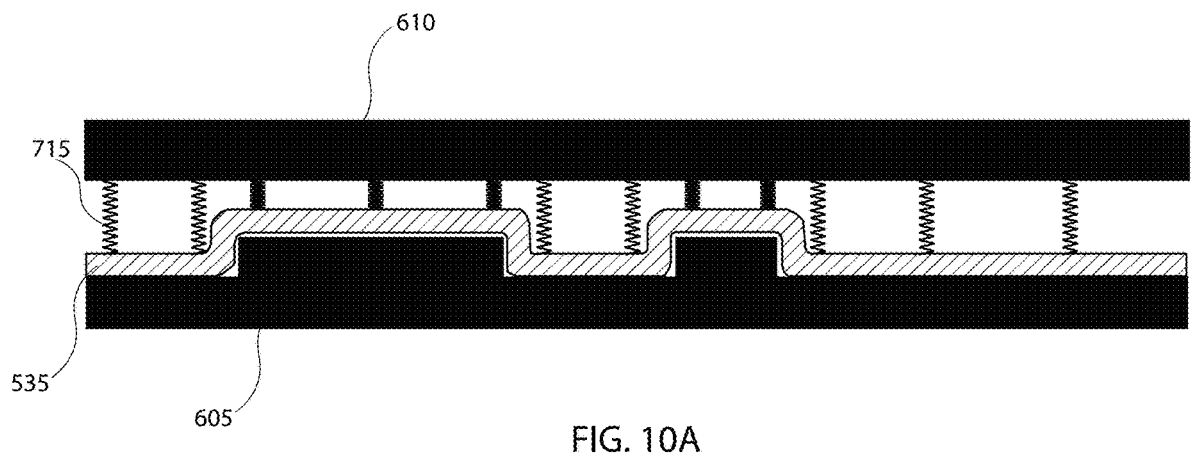
Figure 10B:
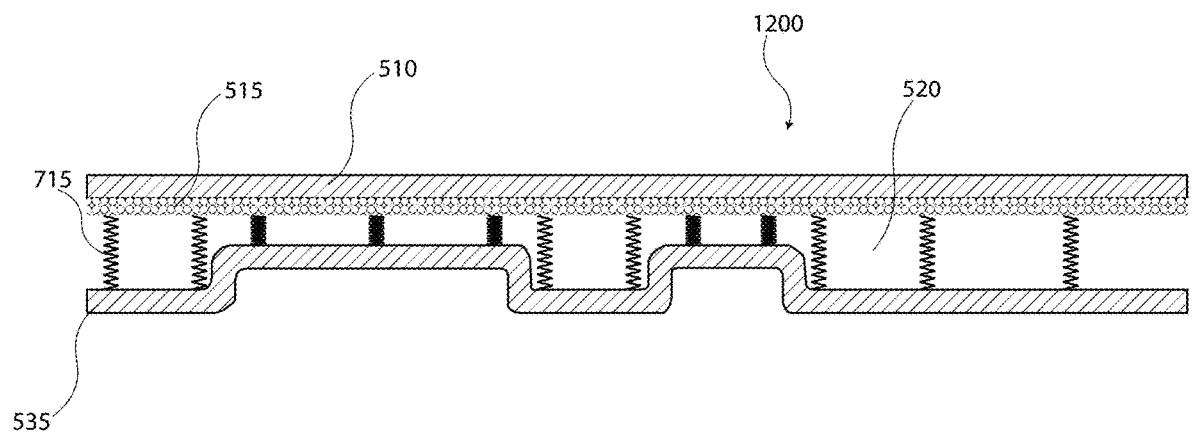

FIG. 8 illustrates thermal ground plane 1000 according to some embodiments. The mesh structure 515, in thermal ground plane 1000, may be disposed in between the plurality of spacers 815A, 815B, and/or 915B. In some embodiments, the plurality of spacers 815A, 815B, and/or 915B may be disposed on the second casing.

FIG. 9A, FIG. 9B, FIG. 10A, and FIG. 10B illustrate steps for fabricating a thermal ground plane with a variable thickness vapor core according to some embodiments. In some embodiments, the plurality of spacers 715 may include spacers with spring-like mechanical behavior. For example, the plurality of spacers 715 can include micro-springs, micro-suspension plates, micro-flexures made of copper, other metal materials, or elastic polymer encapsulated by hermetic seal. In some embodiments, the plurality of spacers 715 may have a mechanical stiffness strong enough to maintain a vapor core in a soft vacuum. In some embodiments, the plurality of spacers 715 may and/or the first casing 510 and/or the second casing 535 may not be too stiff, so the shape of the vapor core 520 can follow the configuration of the circuit board 530 (and/or circuit elements 525 and/or 540) under pressure from the shell of a mobile system (e.g., shell 505). In the regions with void space, the vapor core 520 may enlarge naturally. In some embodiments, the plurality of spacers 715 can be fabricated with a non-uniform distribution of heights or sizes, so deformations of the plurality of spacers 715 can be designed to accommodate different void spaces. In some embodiments, the first casing 510 and/or the second casing 535 can be formed with a desirable shape, followed by forming the plurality of spacers 715 fabricated on the casing. The plurality of spacers 715, for example, can be a continuous mesh layer or a porous layer. This single layer can consist of two sublayers or multiple sublayers.

In some embodiments, the plurality of spacers may be elastic (e.g., have spring like qualities) may allow the thermal ground plane to self-adjust and/or morph into circuit board gaps. In some embodiments, the vapor core 520 can include elastic plurality of spacers that can vary in height. In some embodiments, elastic or spring-like spacers and the first casing 510 and/or the second casing 535 can be deformed according to the void space to be used for enhancing vapor transport. In some embodiments, a coolant can be selected to operate with positive pressure pushing the first casing 510 and/or the second casing 535 outward, so the coolant itself serves as the spring-like material.

Figure 11:
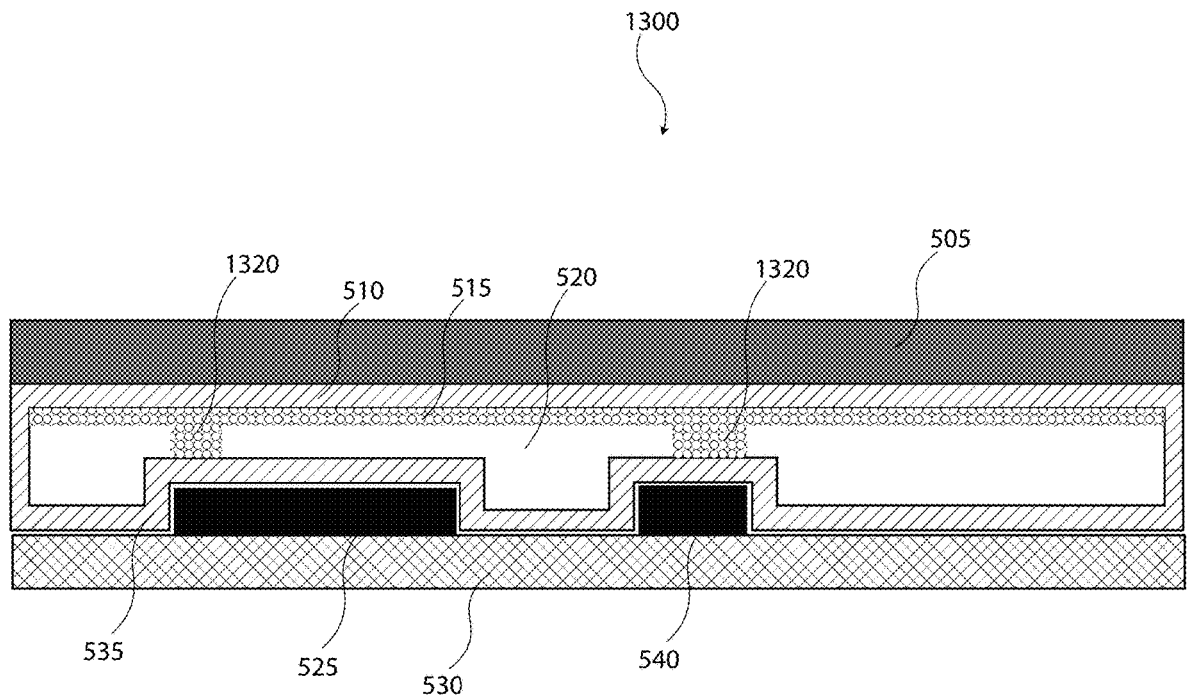
FIG. 11 illustrates a thermal ground plane that may include additional wicking structure(s) disposed within the vapor core in areas where the thermal ground plane may be placed near circuit elements and such as, for example, circuit elements that produce more heat than other circuit elements.

FIG. 11 illustrates a thermal ground plane 1300 that may include additional wicking structure(s) 1320 disposed within the vapor core 520 in areas where the thermal ground plane 1300 may be placed near circuit elements 525 and 540 such as, for example, circuit elements that produce more heat than other circuit elements. The additional wicking structure(s) 1320, for example, may be used to reduce, for example, high heat fluxes produced by some circuit elements. In some embodiments, the additional wicking structure(s) 1320 may be connected to, in contact with, and/or coupled with one or more other wicking structures 515 and/or first casing 510. In some embodiments, the additional wicking structure(s) 1320 can be made from copper, stainless steel, titanium, ceramics, or polymer. In some embodiments, the additional wicking structure(s) 1320 may include or be coated with an additional layer to protect it from reactions with fluid if needed.

In some embodiments, additional wicking structures 1320 may be connected to the wicking structure 515 such as, for example, in order to supply liquid water for continuous evaporation. Vapor temperatures in regions near hot chips (e.g., circuit elements) are high and the corresponding vapor transport may be good. This may allow a reduced thickness of the vapor core in such hot regions without performance degradation.

Figure 12:
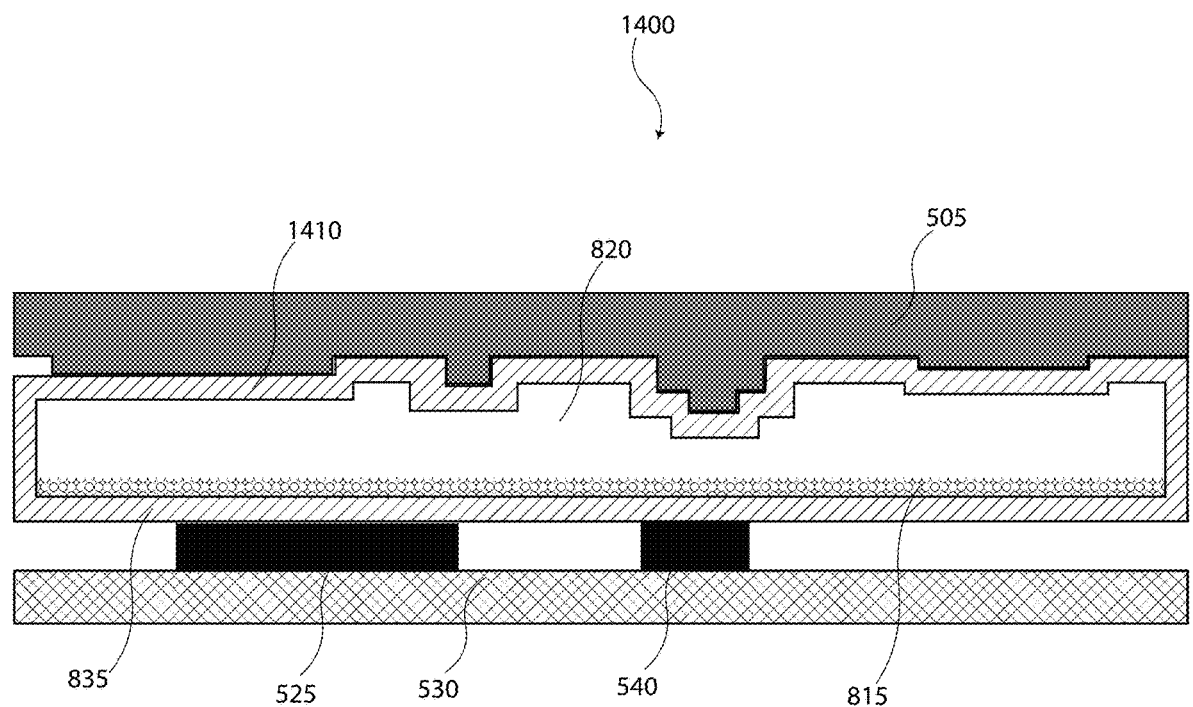
FIG. 12 illustrates a thermal ground plane with a first casing, which has a first casing with a variable height that may adapt to the contour of the device shell. In some embodiments, vapor transport can be enhanced using the void space associated with the device shell.

FIG. 12 illustrates a thermal ground plane 1400 with a first casing 1410, which has a first casing 1410 with a variable height that may adapt to the contour of the device shell 505. In some embodiments, vapor transport can be enhanced using the void space associated with the device shell 505. The device shell 505 of each system can be an important element to thermal management. For example, heat may be removed from the circuit elements 525 and 540 to ambient air. In some embodiments, the goal of thermal management may be to spread heat from hot circuit elements 525 and 540 to the device shell 505, which may be cooled by the ambient environment. Many device shells (e.g., device shell 505) may not be flat. Device shells, for example, may have three-dimensional shapes to accommodate different design requirements. This may result in a device shell that may have various void spaces. The vapor core 820 of thermal ground plane 1400 may have a variable thickness that may be formed by accommodating the three-dimensional shape of the device shell 505 according to some embodiments. In some embodiments, the wicking structure 815 may be disposed near the circuit board 530 and/or circuit elements 525 and/or 540.

Figure 13:
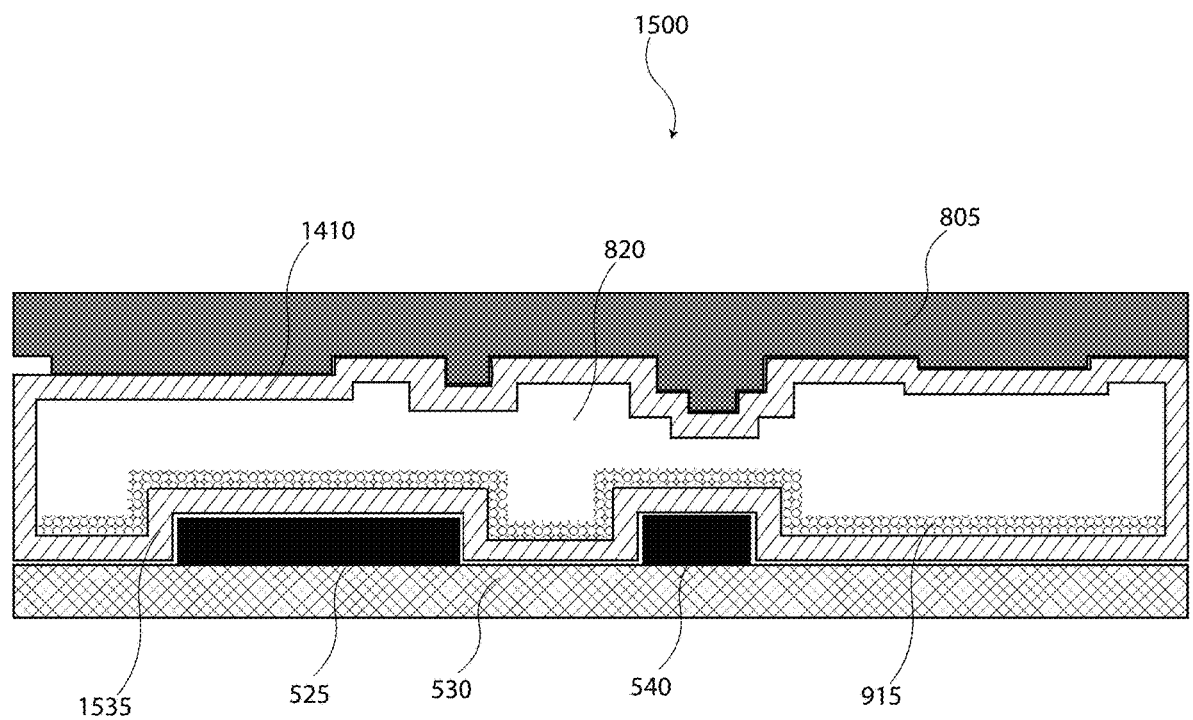
FIG. 13 illustrates a thermal ground plane with a first casing having a variable height and a second casing having a variable height according to some embodiments.

FIG. 13 illustrates a thermal ground plane 1500 with a first casing 1410 having a variable height and a second casing 1535 having a variable height according to some embodiments. The first casing 1410, for example, may have a variable height that adapts to a device shell 805. The second casing 1535, for example, may have a variable height that that adapts to a circuit board 530 and/or circuit elements 525 and 540. In this example, the wicking structure 1515 may be disposed on, in contact with, attached to, coupled with, grown on, etc. the second casing 1535.

Figure 14:
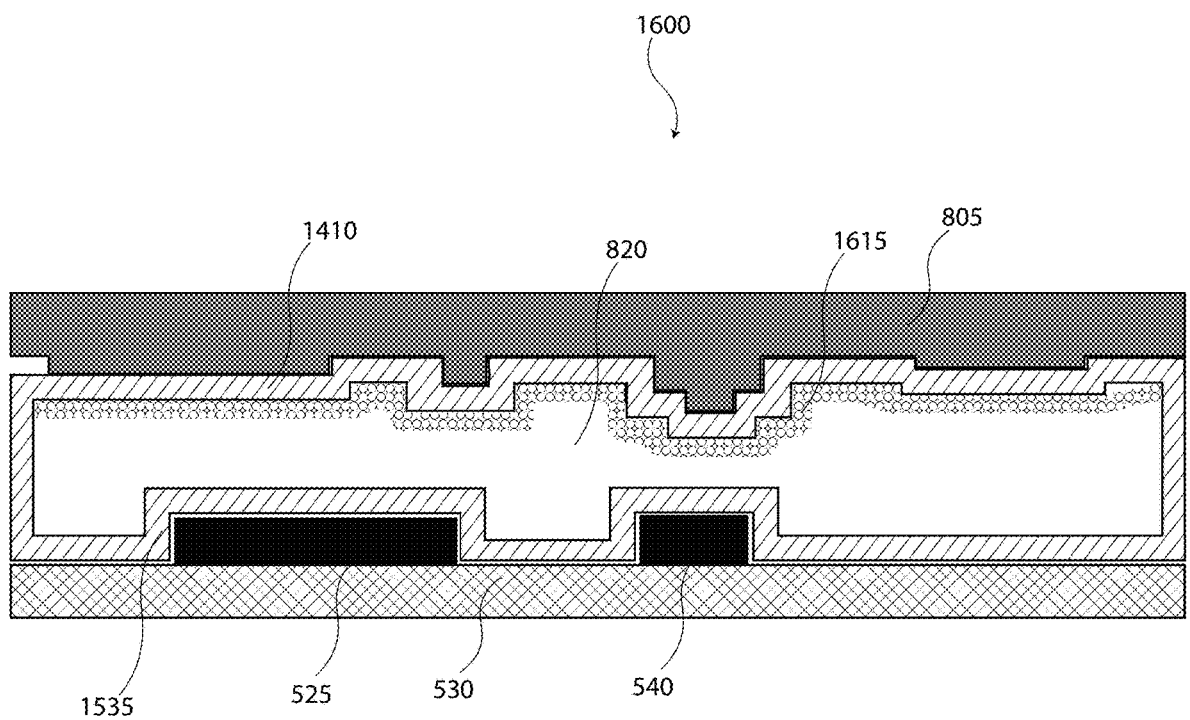
FIG. 14 illustrates a thermal ground plane with a first casing having a variable height and a second casing having a variable height according to some embodiments.

FIG. 14 illustrates a thermal ground plane 1600 with a first casing 1410 having a variable height and a second casing 1535 having a variable height according to some embodiments. The first casing 1410, for example, may have a variable height that adapts to a device shell 805. The second casing 1535, for example, may have a variable height that that adapts to a circuit board 530 and/or circuit elements 525 and 540. In this example, the wicking structure 1615 may be disposed on, in contact with, attached to, coupled with, grown on, etc. the first casing 1410.

In some embodiments, thermal ground plane 1500 and/or thermal ground plane 1600 void space in the device shell 805 and/or the circuit board 530 (and/or the circuit elements 525 and/or 540) can be used to enhance vapor transport. In some embodiments, one or more wicking structures may be disposed near either the first casing 805 and/or the second casing 835 disposed near the circuit elements.

Some embodiments include a circuit board with one or more void spaces created, organized, designed, etc. to optimize vapor transport within an associated thermal ground plane. Typical circuit boards may be optimally designed with a consideration of electrical, mechanical, thermal, and/or other performance metrics. The void space may also be optimized. For example, a circuit board may be designed to enhance vapor transport within the associated vapor core of a thermal ground plane. There is always a void space; such space, for example, can be arranged optimally for the enhancement. Major considerations are the size including the gap of the void space and/or the vapor temperatures in the void space. The vapor transport may be less effective with lower vapor temperatures. It may, in some cases, be desirable to have an enlarged vapor core in regions away from heat sources such as, for example, circuit elements. In those regions, vapor temperatures are lower and need additional gap for effective transport.

Some embodiments may also include a device shell created, arranged, designed, organized, formed, etc. with void space to optimize vapor transport. Typical device shells may be designed with a consideration of electrical, mechanical, thermal and other performance metrics. The void space may also be optimized. In some embodiments, the void space can be used to enhance vapor transport and the associated thermal performance of a thermal ground plane. The circuit board and/or the casing (or shell), for example, may represent key components in a mobile system. There may always be void space; such space can be arranged optimally for the enhancement. Major considerations may include, for example, the size including the gap of the void space and the vapor temperatures in the void space.

The term "substantially" means within 5% or 10% of the value referred to or within manufacturing tolerances.

Various embodiments are disclosed. The various embodiments may be partially or completely combined to produce other embodiments.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A thermal ground plane comprising:
   a first casing comprising a top inner surface that extends across the entire length and the entire width of the first casing, wherein the top inner surface that extends across the entire length and the entire width of the first casing is substantially flat;
   a second casing comprising a bottom inner surface that extends across an entire length and an entire width of the second casing,
      wherein the bottom inner surface that extends across the entire length and the entire width of the second casing is not flat;
      wherein the bottom inner surface that extends across the entire length and the entire width of the second casing has a contour that is different than the top inner surface that extends across the entire length and the entire width of the first casing, and
      wherein the second casing and the first casing configured to enclose a working fluid;
   an evaporator region disposed at least partially on at least one of the first casing and the second casing;
   a condenser region disposed at least partially on at least one of the first casing and the second casing;
   a wicking layer disposed between the first casing and the second casing; and
   a vapor core defined at least partially by a gap between the first casing and the second casing, wherein the thickness of the gap varies across the first casing and the second casing.

2. The thermal ground plane according to claim 1, wherein the gap is designed to provide space for enlarging the gap of the vapor core.

3. The thermal ground plane according to claim 1, wherein a gap adjacent with the evaporator region has a thickness less than the average gap thickness.

4. The thermal ground plane according to claim 1, wherein a gap nonadjacent to the evaporator region has a thickness greater than the average gap thickness.

5. The thermal ground plane according to claim 1, wherein either or both the first casing and the second casing comprise a material that stretches and/or contracts enlarging the gap.

6. The thermal ground plane according to claim 1, further comprising a plurality of spacers disposed within the gap.

7. The thermal ground plane according to claim 1, wherein the wicking layer is in contact with either or both the first casing layer and/or the second casing.

8. The thermal ground plane according to claim 1, further comprising an additional wicking material in contact with wicking layer and the evaporator region.

9. The thermal ground plane according to claim 6, wherein the plurality of spacers comprise copper or a polymer encapsulated by a hermetic seal.

10. The thermal ground plane according to claim 6, wherein the plurality of spacers comprises springs.

11. The thermal ground plane according to claim 6, wherein the plurality of spacers comprises elastic material.

12. The thermal ground plane according to claim 6, wherein the gap has a thickness less than 50 µm.

13. The thermal ground plane according to claim 1, wherein the gap is defined by an internal pressure that is higher than an ambient pressure.

14. A thermal ground plane comprising:
   a first casing that is substantially flat across the entire length and the entire width of the first casing;
   a second casing that is not flat across the entire length and the entire width of the second casing, wherein the second casing and the first casing enclose a working fluid;
   an evaporator region disposed at least partially on at least one of the first casing and the second casing;
   a condenser region disposed at least partially on at least one of the first casing and the second casing;

a wicking layer disposed between the first casing and the second casing; and a vapor core defined at least partially by a gap between the first casing and the second casing, wherein the thickness of the gap varies across the first casing and the second casing.

* * * * *